United States Patent [19]
Park

[11] Patent Number: 6,100,151
[45] Date of Patent: Aug. 8, 2000

[54] HIGHLY INTEGRATED BIPOLAR JUNCTION TRANSISTORS HAVING TRENCH-BASED EMITTER AND BASE REGIONS AND METHODS OF FORMING SAME

[75] Inventor: Kang-Wook Park, Seoul, Rep. of Korea

[73] Assignee: Samsung Electronics Co., Ltd., Rep. of Korea

[21] Appl. No.: 09/075,157

[22] Filed: May 8, 1998

[30] Foreign Application Priority Data

Jul. 1, 1997 [KR] Rep. of Korea ............... 97-30453

[51] Int. Cl.[7] ............................... H01L 21/8222
[52] U.S. Cl. ............... 438/318; 438/318; 438/268; 438/378; 438/586
[58] Field of Search ............... 438/318, 133, 438/138, 268, 378; 257/586, 139

[56] References Cited

U.S. PATENT DOCUMENTS

| | | | |
|---|---|---|---|
| 5,171,702 | 12/1992 | Prengle et al. | 437/59 |
| 5,382,828 | 1/1995 | Neudeck et al. | 257/586 |
| 5,679,966 | 10/1997 | Baliga et al. | 257/139 |
| 5,879,967 | 3/1999 | Kim | 438/133 |

*Primary Examiner*—David Nelms
*Assistant Examiner*—Phuc T. Dang
*Attorney, Agent, or Firm*—Myers Bigel Sibley & Sajovec

[57] ABSTRACT

Highly integrated bipolar junction transistors include a semiconductor region, a collector region of first conductivity type in the semiconductor region and a trench extending adjacent the collector region. A three-dimensional base region of second conductivity type is also provided. The base region extends along a bottom of the trench and forms a P-N junction with the collector region. An emitter region of first conductivity type is also provided in the base region. The emitter region extends along a sidewall of the trench. The base region preferably comprises an extrinsic base region extending opposite the bottom of the trench and an intrinsic base region extending opposite the sidewall of the trench. The conductivity of the extrinsic base region is greater than the conductivity of the intrinsic base region. The collector region also comprises an extrinsic collector region extending adjacent a face of the semiconductor region and an intrinsic collector region extending between the extrinsic collector region and the intrinsic base region. Like the base region, the conductivity of the extrinsic collector region is greater than the conductivity of the intrinsic collector region. An emitter electrode is also preferably provided. The emitter electrode ohmically contacts the emitter region at a location extending adjacent the sidewall of the trench. A base contact is also provided on the extrinsic base region and extends opposite the bottom of the trench.

19 Claims, 5 Drawing Sheets

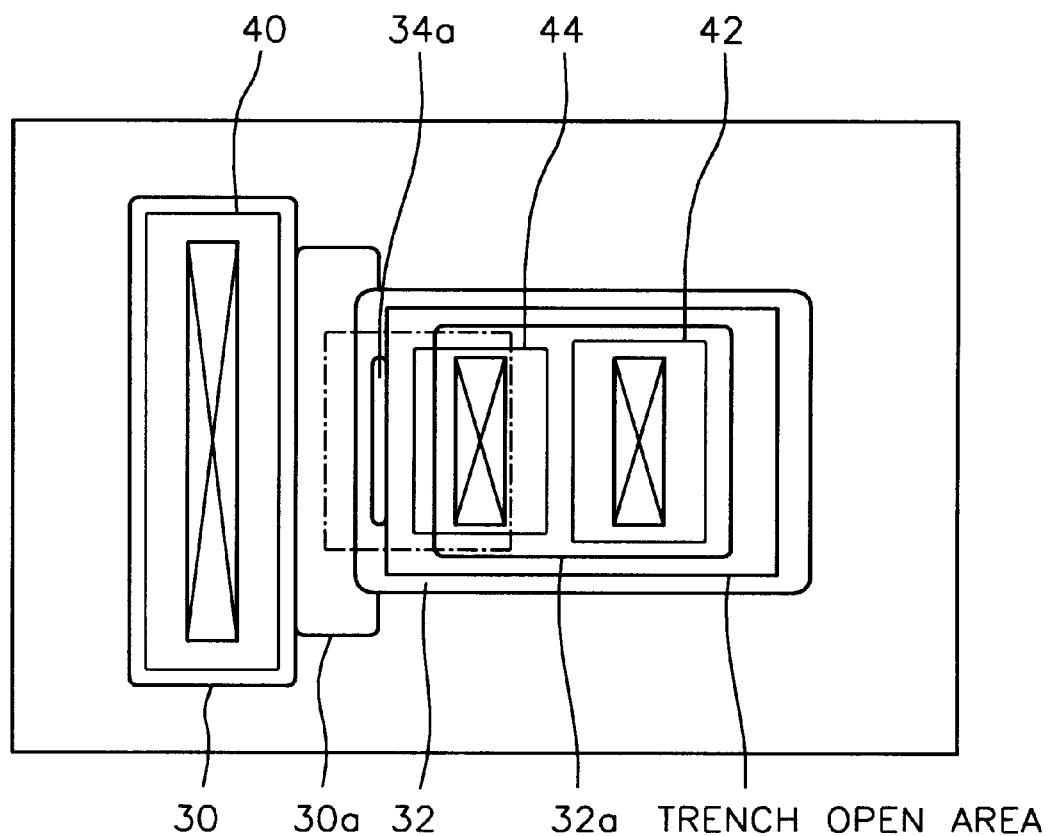

HIGHLY INTEGRATED BIPOLAR JUNCTION TRANSISTORS HAVING TRENCH-BASED EMITTER AND BASE REGIONS AND METHODS OF FORMING SAME

FIELD OF THE INVENTION

The present invention relates to semiconductor devices and fabrication methods, and more particularly to bipolar junction transistors and methods of forming bipolar junction transistors.

BACKGROUND OF THE INVENTION

As state-of-the-art computer systems and circuits evolve, there is a continuing need for higher performance bipolar junction transistors capable of operating at higher switching speeds, with increasing degrees of device integration, and with low rate of failure. There is also a continuing need to shrink or scale down device size to obtain improved device performance.

Various techniques for forming high performance bipolar junction transistors have been developed. One technique for forming a conventional bipolar junction transistor, as illustrated by FIG. 1, is described in an article entitled "Lamp-Heated Rapid Vapor Phase Doping Technology for 100-GHz Si Bipolar Transistors, IEEE BCTM, 11:1, p. 173. Referring now to FIG. 1, a conventional bipolar junction transistor includes opposing insulator-filled trenches for providing electrical isolation and a buried extrinsic collector region 112a. A buried intrinsic collector region 130a, base region 133 and emitter region 134a are also provided between the buried extrinsic collector region 112a and a face of the semiconductor substrate 110. A collector contact region 130 is also provided between the extrinsic collector region 112a and the face. An in-situ boron-doped polysilicon layer (IBDP) is provided as a base electrode in ohmic contact with the base region 133. An in-situ phosphorus-doped polysilicon layer (IPDP) is provided as an emitter electrode in ohmic contact with the emitter region 134a and an in-situ phosphorus-doped polysilicon layer (IPDP) is provided as a collector electrode in ohmic contact with the collector contact region 130. Tungsten contact layers are provided on the emitter, base and collector electrodes, as illustrated. Field oxide isolation regions 120 and an electrically insulating layer 127 define an active portion of the substrate 110 and provide electrical isolation/passivation, respectively. Collector, emitter and base contacts 140, 144 and 142 are also provided, respectively.

Unfortunately, the bipolar junction transistor of FIG. 1 may suffer from an excessive parasitic collector-substrate capacitance ($C_{CS}$) which may be a result of the relatively large junction area between the highly doped extrinsic collector region 112a and the substrate 110. This excessive parasitic capacitance can limit the maximum operating speed of the bipolar junction transistor. In addition, because the illustrated bipolar junction transistor utilizes multiple layers of in-situ doped polysilicon as electrodes, the vertical topology of the transistor may be degraded and the complexity of the associated technology for processing the transistor may be increased.

Thus, notwithstanding this and other conventional bipolar junction transistors, there continues to be a need for high speed and highly integrated bipolar transistors with reduced parasitic capacitances, improved topology and reduced unit cell size.

SUMMARY OF THE INVENTION

It is therefore an object of the present invention to provide improved bipolar junction transistors and methods of forming same.

It is another object of the present invention to provide bipolar junction transistors having reduced parasitic capacitance characteristics, and methods of forming same.

It is still a further object of the present invention to provide methods of forming bipolar junction transistors having a reduced number of process steps.

It is still another object of the present invention to provide bipolar junction transistors having reduced unit cell size and improved vertical topology, and methods of forming same.

These and other objects, features and advantages of the present invention are provided by bipolar junction transistors which include a semiconductor region (e.g., an undoped epitaxial layer), a collector region of first conductivity type in the semiconductor region and a trench extending adjacent the collector region. A three-dimensional base region of second conductivity type is also provided. The base region extends along a bottom of the trench and forms a P-N junction with the collector region. An emitter region of first conductivity type is also provided in the base region. According to a preferred aspect of the present invention, the emitter region extends along a sidewall of the trench. The base region preferably comprises an extrinsic base region extending opposite the bottom of the trench and an intrinsic base region extending opposite the sidewall of the trench. The conductivity of the extrinsic base region is preferably greater than the conductivity of the intrinsic base region. The collector region also comprises an extrinsic collector region extending adjacent a face of the semiconductor region and an intrinsic collector region extending between the extrinsic collector region and the intrinsic base region. The conductivity of the extrinsic collector region is preferably greater than the conductivity of the intrinsic collector region. An emitter electrode is also preferably provided. The emitter electrode ohmically contacts the emitter region at a location extending adjacent the sidewall of the trench. A base contact is also provided on the extrinsic base region and extends opposite the bottom of the trench.

Preferred methods of forming the above-described bipolar junction transistors are also provided. These methods include the steps of forming a semiconductor epitaxial layer on a substrate. The substrate may be a semiconductor substrate of first or second conductivity type (e.g., N-type or P-type) or an electrically insulating substrate, for example. The epitaxial layer is preferably formed to have relatively low conductivity. A relatively highly doped extrinsic collector region of first conductivity type is preferably formed in the epitaxial layer and extends to a face thereof. A composite electrically insulating region (ONO), comprising a first oxide layer, a nitride layer and a second oxide layer, is also formed on the face of the epitaxial layer. The extrinsic collector region may be formed by patterning an implant mask on the first oxide layer and then selectively implanting first conductivity type dopants through first oxide layer and into the epitaxial layer at a predetermined energy and dose.

A shallow trench is then formed in the epitaxial layer, at a location closely adjacent the extrinsic collector region. The shallow trench may have a depth of about 1 μm and may be formed by a conventional patterned etching step using an etching mask formed on the second oxide layer. A protective insulating layer is then formed on the exposed sidewall and bottom portions of the shallow trench. This protective insulating layer, which preferably inhibits contamination and implant damage caused by subsequent ion implantation steps, may have a thickness in a range of about 20–1000 Å. Next, an implantation mask is formed on the protective insulating layer and then patterned to expose a portion of the protective insulating layer extending opposite the sidewall of the trench. Dopants of first conductivity type (e.g., N-type) are then preferably implanted through the exposed portion of the protective insulating layer and into the epitaxial layer, at a predetermined dose and energy level. In particular, the implant dose and energy level may be selected so that an intrinsic collector region may be formed with appropriate dimensions and with a lower first conductivity type conductivity relative to the extrinsic collector region. For implantation into the sidewall of the trench, these first conductivity type dopants may be implanted at a predetermined tilt angle (e.g., 0–7°) relative to a normal to the face of the epitaxial layer. A short duration annealing step may also be performed to drive in and activate the implanted dopants of first conductivity type.

The implant mask may then be removed to expose the protective insulating layer. Alternatively, the same mask may be used during a step of implanting second conductivity type dopants (e.g., P-type) into the sidewall at a predetermined dose, energy level and tilt angle so that during a subsequent annealing step, an intrinsic base region may be formed between the intrinsic collector region and the sidewall of the trench. Another implant mask is then formed and patterned in the trench to expose a portion of the protective insulating layer extending opposite the bottom of the trench. Second conductivity type dopants (e.g., P-type) are then implanted at a predetermined energy and dose level (and possibly while rotating the substrate). These dopants are then driven into the epitaxial layer to form a highly conductive extrinsic base region, by performing an annealing step of sufficient temperature and duration. During this annealing step, the dopants for the intrinsic collector region, intrinsic base region and extrinsic base region may be driven in simultaneously to substantially their full and final lateral and vertical dimensions. However, in the event the above step of implanting dopants of second conductivity type into the sidewall of the trench is not performed (using the same implantation mask that was used to form the intrinsic collector region), another masking and implantation step may be performed to expose another portion of the protective insulating layer extending opposite the sidewall of the trench. Dopants of second conductivity type may then be implanted into the sidewall at appropriate dose and energy levels so that an intrinsic base region can be formed. This implantation step is preferably performed before the above annealing step.

Sidewall insulating spacers are then formed on exposed portions of the composite electrically insulating region and on portions of the protective insulating layer extending opposite the sidewall of the trench. These spacers may be formed by conformally depositing a blanket CVD oxide layer and then performing an etch-back step to expose a portion of the protective insulating layer extending opposite the bottom of the trench. The etching step may also be performed to etch through the exposed portion of the protective insulating layer and expose the bottom of the trench. A conductive layer is then deposited, etched and annealed using conventional techniques to form a highly conductive metal silicide layer in ohmic contact with the extrinsic base region. The trench is then filled with an electrically insulating layer. In particular, a blanket CVD oxide layer (e.g., tetraethylorthosilicate (TEOS)) may be deposited and then planarized using an etch-back process (e.g., wet etching, CMP, etc.), to fill the trench. A photolithographic patterning step is then performed to define an emitter contact hole in the electrically insulating layer and composite electrically insulating region and expose the intrinsic base region at a location extending adjacent the sidewall of the trench. An emitter electrode of first conductivity type is then preferably formed in the contact hole. This emitter electrode may be formed by conformally depositing a highly doped first conductivity type polysilicon layer on the composite electrically insulating region and then patterning the layer to define the emitter electrode in the emitter contact hole. An annealing process is then preferably performed to diffuse first conductivity type dopants from the emitter electrode into the intrinsic base region 33 and define an emitter region therein.

A passivation layer is then formed on the composite electrically insulating region. The passivation layer may be formed by depositing a layer of borophosphosilicate glass (BPSG), high temperature oxide (HTO), low temperature oxide layer (LTO), TEOS or spin-on glass (SOG) using a conventional techniques. Conventional techniques are then used to define collector, emitter and base contact holes. Metallization in the form of an aluminum, tungsten or titanium layer, for example, or alloy thereof, is then deposited and patterned using conventional techniques to define collector, emitter and base contacts. By using the above described steps, a highly integrated bipolar junction transistor can be formed with reduced parasitic collector-substrate junction capacitance. Improved vertical topology is also achieved by eliminating the separate layers of conductive material (e.g., polysilicon) used to form base and emitter electrodes in conventional devices. Reduced unit cell size can also be achieved by using a trench to facilitate formation of a three-dimensionally-shaped base region.

BRIEF DESCRIPTION OF THE DRAWINGS

FIG. 8 is a plan layout view of a preferred bipolar junction transistor, according to an embodiment of the present invention.

DESCRIPTION OF PREFERRED EMBODIMENTS

Figure 1:
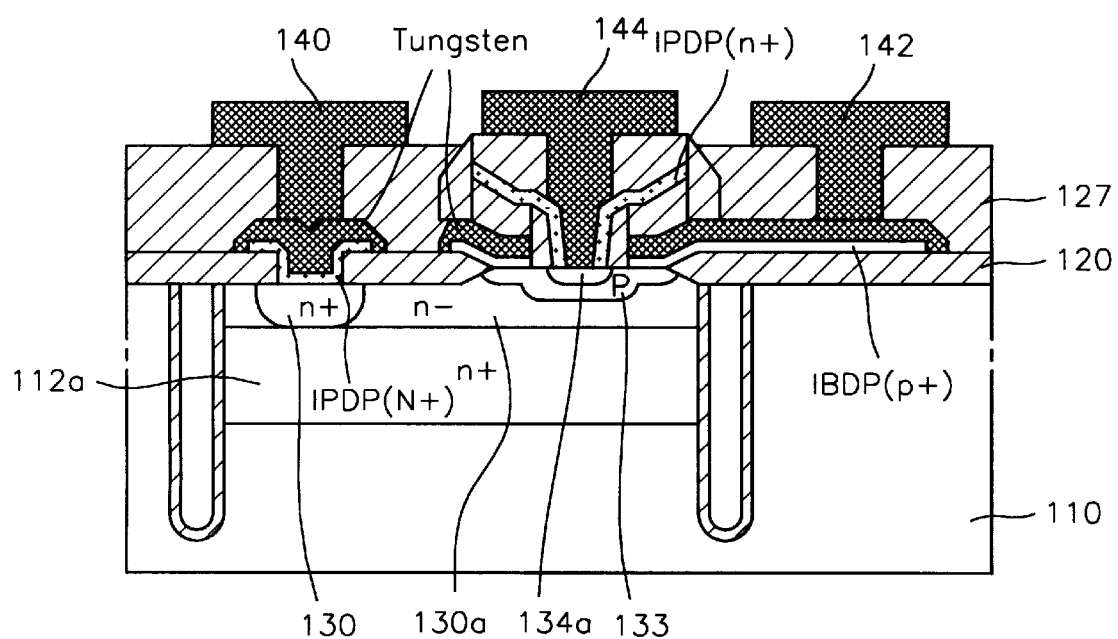
FIG. 1 is a cross-sectional view of a bipolar junction transistor according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Figure 2:
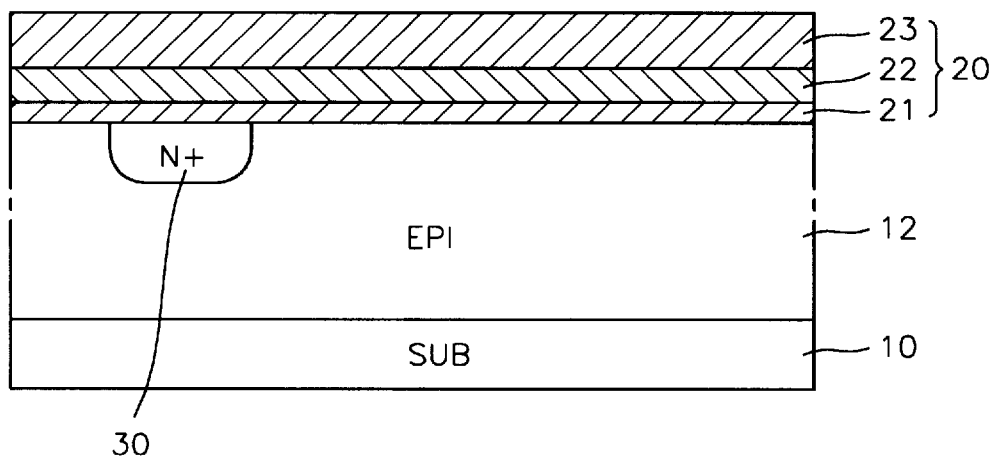
FIGS. 2–7 are cross-sectional views of intermediate structures which illustrate a method of forming a preferred bipolar junction transistor according to an embodiment of the present invention.

Referring now to FIGS. 2–7, methods of forming preferred bipolar junction transistors will be described. In particular, as illustrated by FIG. 2, steps are performed to form a semiconductor epitaxial layer 12 on a substrate 10.

The substrate 10 may be a semiconductor substrate of first or second conductivity type (e.g., N-type or P-type) or an electrically insulating substrate, for example. In the event the substrate 10 comprises an electrically insulating substrate, such as a silicon dioxide substrate, the epitaxial layer 12 may be formed to a predetermined thickness using conventional techniques such as Epitaxial Lateral Overgrowth (ELO) or Confined Lateral Selective Epitaxial Overgrowth (CLSEG), for example. Accordingly, the epitaxial layer 12 and substrate 10 may collectively form a Silicon-On-Insulator (SOI) substrate. Because the epitaxial layer 12 forms closely adjacent junctions with base and collector regions, as described more fully hereinbelow, the epitaxial layer 12 is preferably formed to have relatively low conductivity relative to the base and collector regions. Most preferably, the epitaxial layer 12 comprises an intrinsic semiconductor such as undoped monocrystalline silicon.

Referring still to FIG. 2, a relatively highly doped extrinsic collector region 30 of first conductivity type (e.g., N-type) is preferably formed in the epitaxial layer 12 and extends to a face thereof, as illustrated. According to one aspect of the present invention, the extrinsic collector region 30 may be formed to have a first conductivity type dopant concentration therein at a level in a range between about $1 \times 10^{18}$ cm$^3$ and $1 \times 10^{20}$ cm$^3$. A composite electrically insulating region 20, comprising a first oxide layer 21, a nitride layer 22 and a second oxide layer 23, is also formed on the face of the epitaxial layer 12. As will be understood by those skilled in the art, the extrinsic collector region 30 (i.e., collector contact region) may be formed by patterning an implant mask (not shown) on the first oxide layer 21 and then selectively implanting first conductivity type dopants through first oxide layer 21 and into the epitaxial layer 12 at a predetermined energy and dose.

Figure 3:
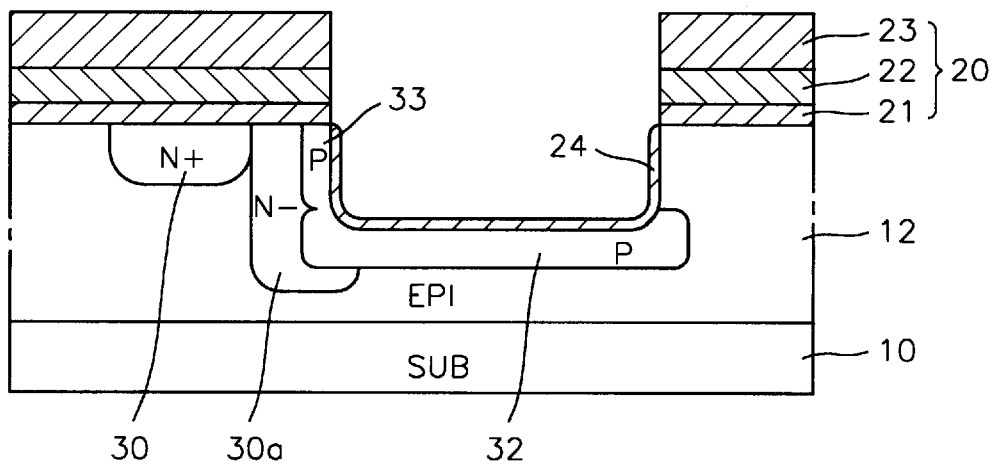

Referring now to FIG. 3, a shallow trench is then formed in the epitaxial layer 12, at a location closely adjacent the extrinsic collector region 30. The shallow trench may have a depth of about 1 $\mu$m and may be formed by a conventional patterned etching step using an etching mask (not shown) formed on the second oxide layer 23. A protective insulating layer 24 (e.g., silicon dioxide) is then formed on the exposed sidewall and bottom portions of the shallow trench. This protective insulating layer 24, which preferably inhibits contamination and implant damage caused by subsequent ion implantation steps, may have a thickness in a range of about 20–1000 Å. Next, an implantation mask (not shown) is formed on the protective insulating layer 24 and then patterned to expose a portion of the protective insulating layer 24 extending opposite the sidewall (left side) of the trench. Dopants of first conductivity type (e.g., N-type) are then implanted through the exposed portion of the protective insulating layer 24 and into the epitaxial layer 12, at a predetermined dose and energy level. In particular, the implant dose and energy level may be selected so that an intrinsic collector region 30a may be formed with appropriate dimensions and with a lower first conductivity type conductivity relative to the extrinsic collector region 30. For implantation into the sidewall of the trench, these first conductivity type dopants may be implanted at a predetermined tilt angle (e.g., 0–7°) relative to a normal to the face of the epitaxial layer 12. A short duration annealing step may also be performed to drive in and activate the implanted dopants of first conductivity type.

Although not shown, the collector region 30 may also be formed as a ring-shaped collector region which, when viewed in transverse cross-section, appears as separate collector regions 30 on both sides of the illustrated trench. Moreover, if a ring-shaped collector region 30 is formed around an annular or square-shaped trench, the above step of implanting first conductivity type dopants into the sidewall of the trench may be performed while rotating the substrate so that a ring-shaped intrinsic collector region (not shown) may be formed.

The implant mask may then be removed to expose the protective insulating layer 24. Alternatively, the same mask may be used during a step of implanting second conductivity type dopants (e.g., P-type) into the sidewall at a predetermined dose, energy level and tilt angle so that during a subsequent annealing step, an intrinsic base region 33 may be formed between the intrinsic collector region 30a and the sidewall of the trench.

Another implant mask (not shown) is then preferably formed and patterned in the trench to expose a portion of the protective insulating layer 24 extending opposite the bottom of the trench. Second conductivity type dopants (e.g., P-type) are then implanted at a predetermined energy and dose level (and possibly while rotating the substrate 10). These dopants are then driven into the epitaxial layer 12 to form a highly conductive extrinsic base region 32, by performing an annealing step of sufficient temperature and duration. During this annealing step, the dopants for the intrinsic collector region 30a, intrinsic base region 33 and extrinsic base region 32 may be driven in simultaneously to substantially their full and final lateral and vertical dimensions, as illustrated. However, in the event the above step of implanting dopants of second conductivity type into the sidewall of the trench is not performed (using the same implantation mask that was used to form the intrinsic collector region 30a), another masking and implantation step may be performed to expose another portion of the protective insulating layer 24 extending opposite the sidewall of the trench. Dopants of second conductivity type may then be implanted into the sidewall at appropriate dose and energy levels so that an intrinsic base region 33 can be formed. This implantation step is preferably performed before the above annealing step is performed to drive in the implanted first and second conductivity type dopants simultaneously.

Figure 4:
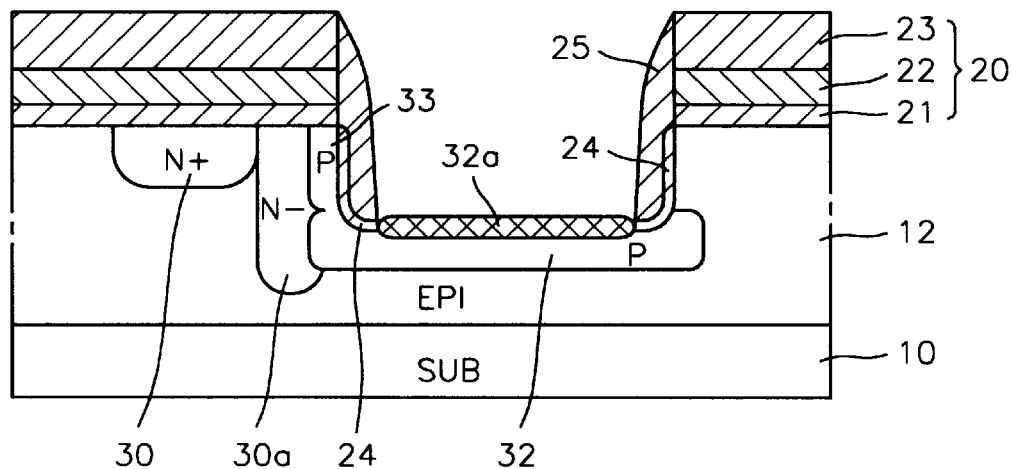

Referring now to FIG. 4, sidewall insulating spacers 25 are formed on exposed portions of the composite electrically insulating region 20 and on portions of the protective insulating layer 24 extending opposite the sidewall of the trench. These spacers 25 (which may be represented as one continuous annular-shaped spacer when viewed in a direction normal to the face of the epitaxial layer 12) may be formed by conformally depositing a blanket CVD oxide layer and then performing an etch-back step to expose a portion of the protective insulating layer 24 extending opposite the bottom of the trench. The etching step may also be performed to etch through the exposed portion of the protective insulating layer 24 and expose the bottom of the trench. A conductive layer, such as a metal layer comprising a material selected from the group consisting of titanium (Ti), tungsten (W), platinum (Pt) and cobalt (Co), for example, is then preferably deposited, etched and annealed using conventional techniques to form a highly conductive metal silicide layer 32a in ohmic contact with the extrinsic base region 32.

Figure 5:
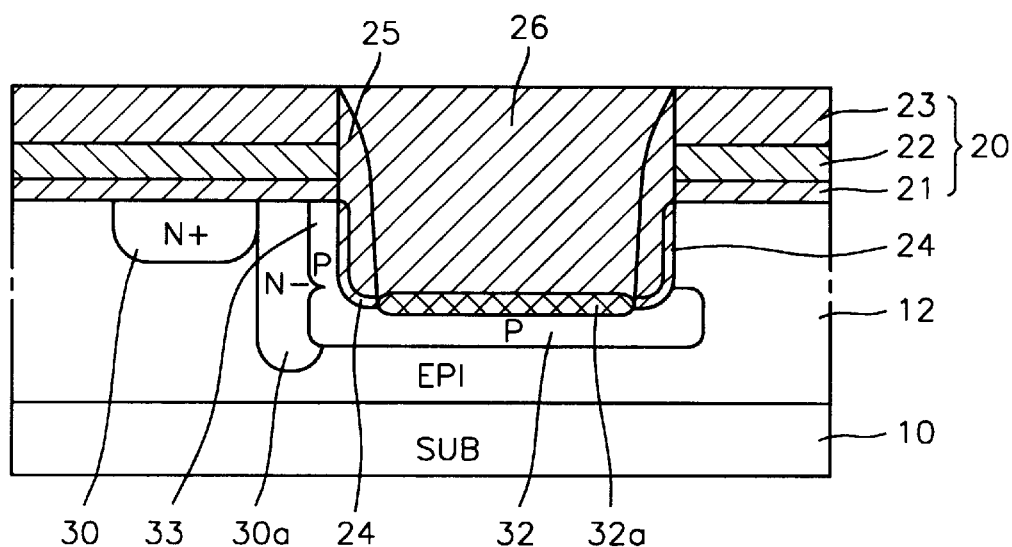
Figure 6:
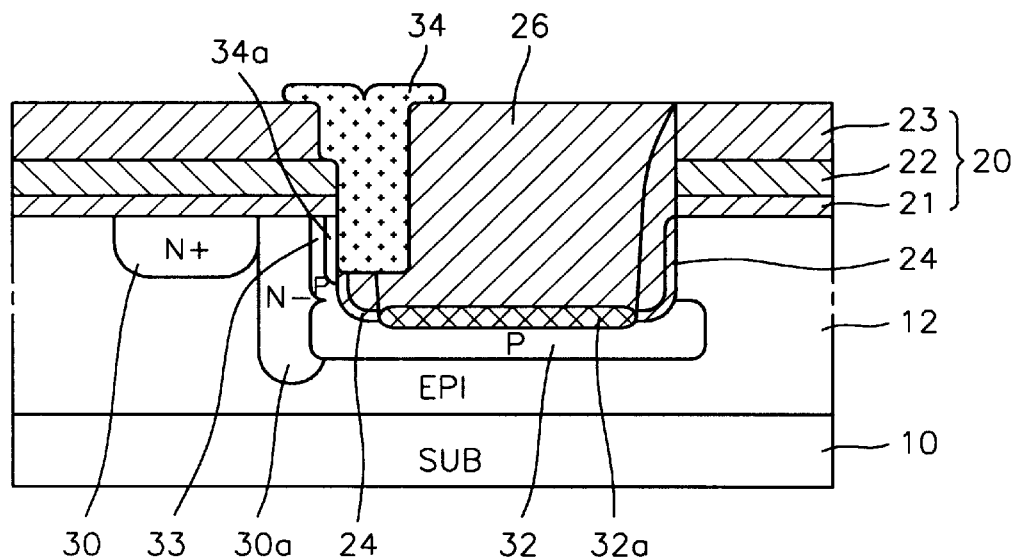

Referring now to FIG. 5, the trench is then filled with an electrically insulating layer 26 (silicon dioxide). In particular, a blanket CVD oxide layer (e.g., tetraethylorthosilicate (TEOS)) may be deposited and then planarized using an etch-back process (e.g., wet etching, CMP, etc.), to fill the trench. As illustrated best by FIG. 6, a photolithographic patterning step is then performed to define an emitter contact hole in the electrically insulating layer 26 and composite electrically insulating region 20 and expose the intrinsic base region 33 at a location extending adjacent the sidewall of the trench. An emitter electrode 34 of first conductivity type is then preferably formed in the contact hole. This emitter electrode 34 may be formed by conformally depositing a highly doped first conductivity type polysilicon layer on the composite electrically insulating region 20 and then patterning the layer to define the emitter electrode 34 in the emitter contact hole. An annealing process is then preferably performed to diffuse first conductivity type dopants from the emitter electrode into the intrinsic base region 33 and define an emitter region 34a therein.

Figure 7:
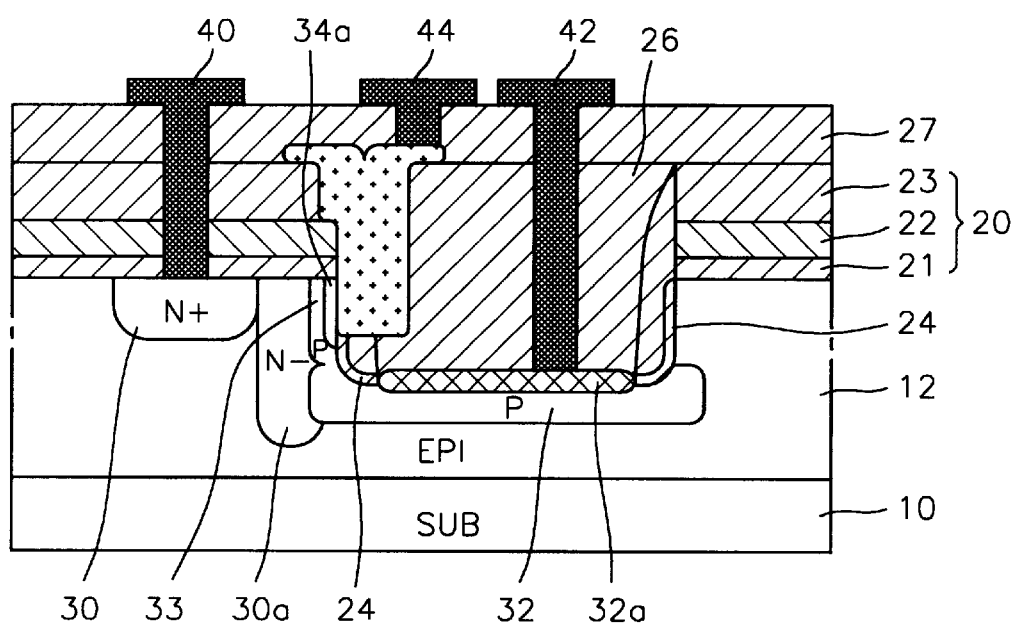

Referring now to FIG. 7, a passivation layer 27 is then formed on the composite electrically insulating region 20. The passivation layer 27 may be formed by depositing a layer of borophosphosilicate glass (BPSG), high temperature oxide (HTO), low temperature oxide layer (LTO), TEOS or spin-on glass (SOG) using conventional techniques. Conventional techniques are then used to define collector, emitter and base contact holes. Metallization in the form of an aluminum, tungsten or titanium layer, for example, or alloy thereof, is then deposited and patterned using conventional techniques to define collector, emitter and base contacts 40, 44 and 42, respectively. Referring now to FIG. 8, a plan layout view of a bipolar junction transistor having a single-sided collector, is illustrated.

According to another embodiment of the present invention, the collector regions and emitter region may be annular-shaped. By using the above described steps, a highly integrated bipolar junction transistor can be formed with reduced parasitic collector-substrate junction capacitance (because the size of the extrinsic collector region is reduced relative to the collector region of the conventional device of FIG. 1). Improved vertical topology is also achieved by eliminating the separate layers of conductive material (e.g., polysilicon) used to form base and emitter electrodes in conventional devices. Reduced unit cell size can also be achieved by using a trench to facilitate formation of a three-dimensionally-shaped base region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bipolar junction transistor, comprising:
a semiconductor region;
a collector region of first conductivity type in said semiconductor region;
a trench in said semiconductor region, extending adjacent said collector region;
a base region of second conductivity type extending along a bottom of said trench, said base region forming a P-N junction with said collector region; and
an emitter region of first conductivity type that forms a P-N junction with said base region and extends to a sidewall of said trench.

2. The bipolar junction transistor of claim 1, wherein said base region extends opposite the sidewall of said trench.

3. A bipolar junction transistor, comprising:
a semiconductor region;
a collector region of first conductivity type in said semiconductor region;
a trench in said semiconductor region, extending adjacent said collector region;
a base region of second conductivity type that extends in said semiconductor region and forms a P-N junction with said collector region, said base region comprising an extrinsic base region extending opposite the bottom of said trench and an intrinsic base region extending opposite the sidewall of said trench, wherein a concentration of second conductivity type dopants in said intrinsic base region is less than a concentration of second conductivity type dopants in said extrinsic base region; and
an emitter region of first conductivity type that extends in said base region and forms a P-N junction therewith.

4. The bipolar junction transistor of claim 3, wherein said collector region comprises an extrinsic collector region extending adjacent a face of said semiconductor region and an intrinsic collector region extending between said extrinsic collector region and said intrinsic base region; and wherein a concentration of first conductivity type dopants in said intrinsic collector region is less than a concentration of first conductivity type dopants in said extrinsic collector region.

5. The bipolar junction transistor of claim 4, further comprising:
an emitter electrode ohmically contacting said emitter region at a location extending adjacent the sidewall of said trench; and
a base contact on said extrinsic base region, at a location extending opposite the bottom of said trench.

6. The bipolar junction transistor of claim 5, wherein said trench is filled with an electrically insulating layer and wherein said emitter electrode and base contact extend through said electrically insulating layer.

7. The bipolar junction transistor of claim 5, wherein said intrinsic collector region and said intrinsic base region extend to the face of said semiconductor region.

8. The bipolar junction transistor of claim 7, further comprising a metal silicide layer contacting said extrinsic base region at a bottom of said trench.

9. A bipolar junction transistor, comprising:
a semiconductor region;
a collector region of first conductivity type in said semiconductor region;
a trench in said semiconductor region, extending adjacent said collector region;
a base region of second conductivity type extending along a bottom of said trench, said base region forming a P-N junction with said collector region;
an emitter region of first conductivity type that extends in said base region and forms a P-N junction therewith; and
a metal silicide layer contacting said extrinsic base region at a bottom of said trench.

10. A bipolar junction transistor, comprising:
a semiconductor region having a face thereon;
a collector region of first conductivity type in said semiconductor region, said collector region comprising an extrinsic collector region extending to the face and an intrinsic collector region;
a trench in said semiconductor region, said trench having a bottom and a sidewall extending from the bottom to the face;
a base region of second conductivity type in said semiconductor region, said base region forming a P-N junction with said intrinsic collector region and extending along a bottom of said trench; and an emitter region of first conductivity type in said base region, said emitter region extending along the sidewall of said trench and forming a P-N junction with said base region.

11. The transistor of claim 10, wherein said base region comprises an extrinsic base region extending along the bottom of said trench and an intrinsic base region extending opposite the sidewall of said trench.

12. A bipolar junction transistors, comprising:

a semiconductor region having a face thereon;

a collector region of first conductivity type in said semiconductor region, said collector region comprising an extrinsic collector region extending to the face and an intrinsic collector region;

a trench in said semiconductor region, said trench having a bottom and a sidewall extending from the bottom to the face;

a base region of second conductivity type in said semiconductor region, said base region forming a P-N junction with said intrinsic collector region and extending along a bottom of said trench; and an emitter region of first conductivity type in said base region, said emitter region extending along the sidewall of said trench and forming a P-N junction with said base region;

wherein said base region comprises an extrinsic base region extending along the bottom of said trench and an intrinsic base region extending opposite the sidewall of said trench;

wherein a conductivity of the intrinsic base region is less than a conductivity of the extrinsic base region.

13. The transistor of claim 12, wherein said emitter region is disposed between the intrinsic base region and the sidewall of said trench.

14. The transistor of claim 13, wherein said semiconductor region comprises an undoped epitaxial layer; and wherein said base and collector regions form respective junctions with said epitaxial layer.

15. The transistor of claim 14, further comprising a sidewall insulating spacer on the sidewall of said trench; and an emitter electrode extending through said sidewall insulating spacer and ohmically contacting said emitter region.

16. The transistor of claim 13, further comprising:

a metal silicide layer extending along the bottom of said trench, in ohmic contact with the extrinsic base region;

an electrically insulating region in said trench; and a base contact extending through said electrically insulating region and ohmically contacting said metal silicide layer.

17. A method of forming a bipolar junction transistor, comprising the steps of:

forming a trench at a face of a semiconductor region;

forming a collector region of first conductivity type extending adjacent a sidewall of the trench;

forming an extrinsic base region of second conductivity type at a bottom of the trench;

forming an intrinsic base region of second conductivity type that extends between the collector region and the sidewall of the trench and has a lower second conductivity type dopant concentration therein relative to the extrinsic base region; and forming an emitter region of first conductivity type in the intrinsic base region, at the sidewall of the trench.

18. The method of claim 17, wherein said step of forming an emitter region comprises the steps of:

forming an emitter electrode of first conductivity type on the intrinsic base region, at a location extending adjacent the sidewall of the trench; and diffusing dopants of first conductivity type from the emitter electrode into the intrinsic base region.

19. The method of claim 17, wherein said step of forming a collector region comprises forming an intrinsic collector region by implanting dopants of first conductivity type into the sidewall of the trench;

wherein said step of forming an extrinsic base region comprises implanting dopants of second conductivity type into the bottom of the trench; and wherein said step of forming an intrinsic base region comprises implanting dopants of second conductivity type into the sidewall of the trench.

* * * * *